United States Patent [19]
Le

[11] Patent Number: 5,214,283
[45] Date of Patent: May 25, 1993

[54] METHOD OF DETERMINING THE CAUSE OF OPEN-VIA FAILURES IN AN INTEGRATED CIRCUIT

[75] Inventor: Tam T. Le, Carrollton, Tex.

[73] Assignee: SGS-Thomson Microelectronics, Inc., Carrollton, Tex.

[21] Appl. No.: 734,571

[22] Filed: Jul. 23, 1991

[51] Int. Cl.[5] .............................................. H01J 37/00
[52] U.S. Cl. ..................................................... 250/307
[58] Field of Search ................................. 250/307, 306

[56] References Cited

U.S. PATENT DOCUMENTS

| | | | |
|---|---|---|---|
| 4,164,461 | 8/1979 | Schilling | 357/65 |
| 4,357,203 | 11/1982 | Zelez | 156/644 |
| 5,035,768 | 7/1991 | Mu et al. | 437/203 |
| 5,059,785 | 10/1991 | Doyle et al. | 250/307 |

OTHER PUBLICATIONS

Chen, et al., "Planarized Aluminum Metallization for Sub-0.5 μm CMOS IEDM" Digest of Technical Papers, paper 3.4.1 (IEEE, Dec. 1990), pp. 51–54.

Lee, et al., "A Selective CVD Tungsten Local Interconnect Technology", IEDM Digest of Technical Papers, (IEEE, Dec. 1988), pp. 450–453.

Ono, et al., "Development of Planarized Al–Si Contact Filling Technology", VMIC Conference (IEEE, Jun. 12–13, 1990), pp. 76–81.

*Primary Examiner*—Bruce C. Anderson
*Attorney, Agent, or Firm*—Rodney M. Anderson; Lisa K. Jorgenson; Richard K. Robinson

[57] ABSTRACT

A method of analyzing an integrated circuit to determine the cause of an open or resistive intermetal via is disclosed. Instead of conventional cross-sectioning of the suspected via, the method removes the upper of the metal layers at the location of the via, with a selective etch to maintain the presence of the contaminant or other cause of failure at the via. When an isotropic metal etch is used, as is preferred, partial removal of the interlevel dielectric layer will facilitate subsequent analysis by increasing the area to be analyzed. Optical microscopy, SEM microscopy, Auger spectroscopy, EDS spectroscopy, and other conventional analysis techniques may be used at the portion of the circuit within the failed via, to indicate the composition of the undesired contaminant.

19 Claims, 9 Drawing Sheets

METHOD OF DETERMINING THE CAUSE OF OPEN-VIA FAILURES IN AN INTEGRATED CIRCUIT

This invention is in the field of integrated circuits, and is more particularly directed to methods of analyzing failures in the same.

BACKGROUND OF THE INVENTION

Both manufacturers and purchasers of integrated circuits are concerned about the causes and rates of electrical failures of such circuits. In the manufacturing and design context, by determining the reasons for time-zero failures of integrated circuits, the manufacturer can identify and implement effective corrective actions in order to increase the manufacturing yield, thereby reducing manufacturing costs. It is also well known that certain failure mechanisms are time-dependent, such that failures of integrated circuits occur at various rates over the operating life of a given population. Manufacturers of integrated circuits predict the reliability of circuits by way of accelerated testing of samples of the production population; analysis of the failure mechanisms from such accelerated testing allows for mechanism-dependent failure rate prediction, and also allows for identification and verification of reliability-related corrective actions. Purchasers and users of integrated circuits are also interested in the causes of field failures, so that corrective action on the vendor's part may be identified and implemented.

In recent years, modern integrated circuits have been fabricated with multiple layers of metallization. A relatively likely location for both time-zero and later life electrical failures in such circuits is the interconnection between the multiple metallization layers, such interconnection generally made by way of metal-filled vias at selected locations through the insulating layer between metallization levels. The interconnecting metal within the via may be the same metal as in the connected layers; for example, interconnection of aluminum metal lines may be made by aluminum-filled vias therebetween. Alternatively, materials other than that of the metallization layers may make the connection therebetween, examples of such materials including tungsten metal, and tungsten and other metal silicides, for the example of aluminum-based metallization systems. Examples of processes for making such interlevel metallization connection through vias are described in Chen, et al., "Planarized Aluminum Metallization for Sub-0.5 $\mu m$ CMOS Technology", *IEDM Digest of Technical Papers*, paper 3.4.1 (IEEE, December 1990), pp. 51-54; Lee, et al., "A Selective CVD Tungsten Local Interconnect Technology", *IEDM Digest of Technical Papers*, (IEEE, December 1988), pp. 450-53; and Ono, et al., "Development of a Planarized Al-Si Contact Filling Technology", *VMIC Conference* (IEEE, Jun. 12-13, 1990), pp. 76-81. Other methods for forming such interconnection are also well known.

Conventional failure analysis techniques generally include layer-by-layer "de-processing" of integrated circuit chips, with visual and elemental inspection of the chip prior to the removal of the next layer. Various types of inspection include, of course, visual inspection of the chip, generally by way of optical microscopy or a scanning electron microscope (SEM). Examples of conventional analytical techniques include Auger and EDS (energy dispersal system) spectroscopy, for qualitatively analyzing the chip surface at selected locations; each of these techniques bombard the chip surface with nuclear particles (electrons, etc.), and measure the frequencies of energy emitted from such bombardment, such frequencies indicative of the elements present at the bombarded location.

The layer-by-layer deprocessing of integrated circuit chips, while commonly used to discover many conventional failure mechanisms, is relatively risky, however, as the causes of certain failure types may be removed along with the prior layer. For example, if a failure is due to a contaminant between two layers, and if the etchant used to remove the overlying layer also removes the contaminant, the true cause of the failure may not ever be determined.

In particular, when an open connection within the via between metal layers is suspected as the cause of failure, prior failure analysis techniques have avoided layerwise deprocessing of the integrated circuit chip, specifically to avoid removing of the cause of failure along with the overlying metallization layer. Therefore, prior failure analysis techniques, in inspecting a suspected open-via failure, have relied upon cleaving the circuit through the suspected failing via, followed by SEM or analytical inspection of the cross-sectional view of the via. Unfortunately, this technique does not always result in successful identification of the failure cause. A first reason for this is the difficulty in accurately sectioning an integrated circuit chip through a desired via, especially as via sizes are shrinking to on the order of one micron or less. Furthermore, a thin insulating layer present within the via may cause an electrical open without being of sufficient thickness as to be visible in cross-section. In addition, analytical techniques such as Auger or EDS may have a sufficiently large spot size that the metallization on either side of the open dwarfs any spectral signal from the failure-causing material. As a result, conventional cross-sectional cleaving of suspected failing vias often does not lead to a determination of the cause of failure.

It is therefore an object of this invention to provide a more reliable technique of analyzing the cause of a failing via.

It is another object of this invention to provide such a method which preserves the evidence of the cause of failure.

It is a further object of this invention to provide such a method which exposes sufficient area of many failure causes as to allow identification of the material thereat with conventional analytical equipment.

Other objects and advantages of the present invention will be apparent to those of ordinary skill in the art having reference to the following specification, together with the claims.

SUMMARY OF THE INVENTION

The invention may be implemented into a method of analyzing a failed integrated circuit, where the failure is suspected to be due to an open circuit within a via between metallization layers. The upper metallization layer is etched with an etchant which selectively removes metal relative to insulating materials, such as that of the interlevel dielectric. For locations within the via at which physical contact exists between the metallization levels, the metal etch also removes the lower metallization layer. At locations where an insulating material is present between metallization layers, the etch will stop, and will not remove the lower metal layer due to masking by the undesired contaminant. Analysis of the cause of failure may be made after the upper level metal etch, or after partial removal of the interlevel oxide. dr

BRIEF DESCRIPTION OF THE DRAWINGS

FIGS. 4a through 4j are actual results of analysis of an actual failed and control via according to the referred embodiment.

DETAILED DESCRIPTION OF THE PREFERRED EMBODIMENT

Figure 2A:
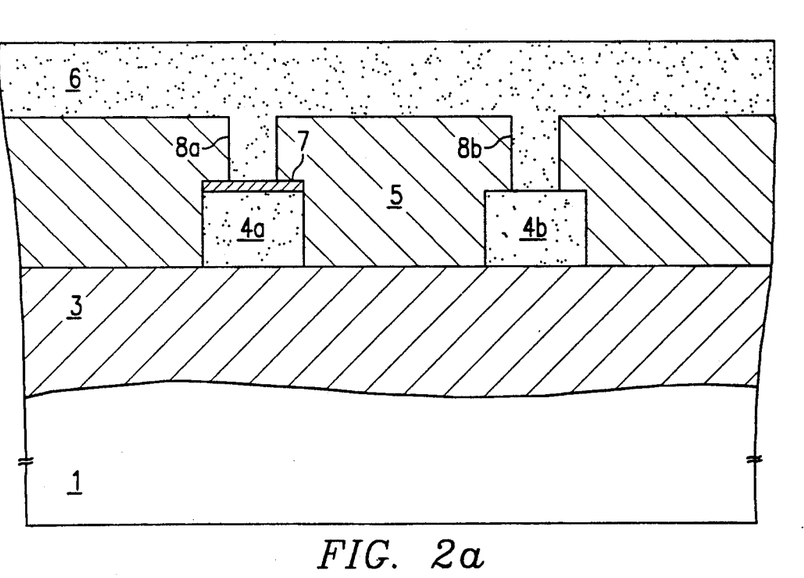
FIGS. 2a through 2c are schematic cross-sectional views of a failing and a non-failing via at various steps of the preferred embodiment of the invention.
Figure 3A:
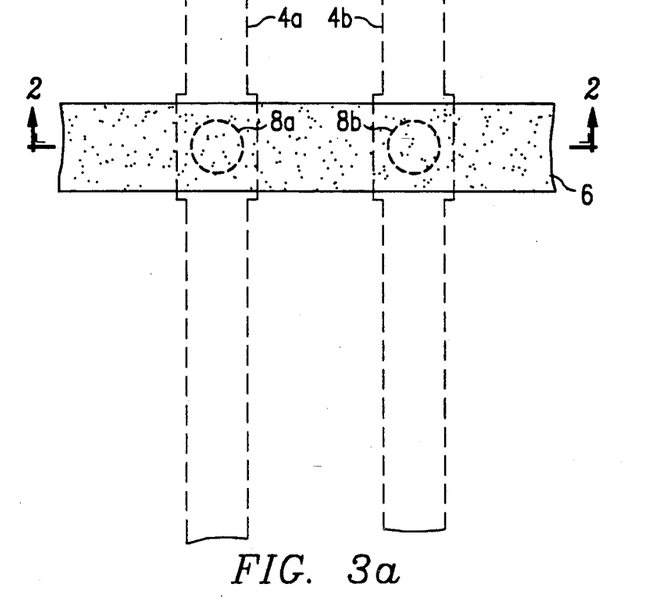
FIGS. 3a through 3c are plan views of the failing and good vias of FIGS. 2a through 2c, at corresponding steps of the process according to the preferred embodiment of the invention.

Referring first to FIGS. 2a and 3a in combination, the context of the present invention will be described relative to an integrated circuit having multiple levels of metallization for conducting electrical signals and energy, with connection therebetween at selected locations. As shown in FIG. 2a in cross-section, the integrated circuit is formed at a surface of semiconductor substrate 1, generally having active and passive components (not shown for clarity) such as transistors, resistors, capacitors and conductors formed thereat. Overlying substrate 1 (or overlying an epitaxial layer, or another active layer such as a silicon-on-insulator layer, as the case may be for the particular technology), is insulating layer 3 and first level metal layer 4 (shown as lines 4a, 4b in FIGS. 2a and 3a). Insulating layer 3 electrically isolates metal lines 4a, 4b from the underlying components in the integrated circuit, except at selected contact locations therethrough (not shown). Accordingly, portions of first metal layer 4 will make contact to semiconductor elements such as transistor terminals (e.g., gate, source, drain), through contact openings etched through insulating layer 3. Conventional materials used for insulating layer 3 include deposited silicon dioxide, generally doped with boron, phosphorous, or both for purposes of reflow, as is well known. Overlying insulating layer 3 and first level metal 4 is interlevel dielectric 5. Interlevel dielectric 5 is also preferably a deposited dielectric material, such as silicon dioxide, and is for electrically isolating first level metal 4 from second level metal 6 formed thereover, except at selected locations at which vias 8a, 8b are formed.

First level metal 4 and second level metal 6 are each preferably formed of a relatively high conductivity material, such as aluminum, which is sputtered, evaporated, deposited by chemical vapor deposition, or otherwise formed into a layer in the manufacture of the circuit. As is well known in the art, aluminum films used in integrated circuit manufacture are generally doped according to the particular characteristics desired. For example, since first level metal 4 is in contact with underlying silicon, first level metal 4 is preferably doped with silicon (e.g., on the order of 0.5 to 1.5% by weight), to reduce junction spiking. Also by way of example, since both first level metal 4 and second level metal 6 may each carry relatively large amounts of current, copper doping on the order of 0.5 to 1.5% by weight is also preferred. For ease of processing, both first level metal 4 and second level metal 6 may be doped with both copper and silicon. Other doping schemes as are well known in the art may also be used.

By way of example, the dimensions of metal lines 4a, 4b, may be on the order of one micron in width and thickness, with vias 8a, 8b, also on the order of one micron in diameter. The circular shape of vias 8a, 8b, conventionally results for vias of this size due to limitations in the etching process, even though the via pattern in the photoresist pattern may be square or rectangular in shape. Metal line 6 may be somewhat wider than metal lines 4a, 4b, due to the increases current requirements thereof. The thickness of interlevel dielectric 5 may be on the order of 10 kÅ. Of course, the dimensions given hereinabove are only for illustrative purposes, as the present invention is useful regardless of the sizes of metal lines and vias to be analyzed.

The metallization used to fill vias 8a, 8b, is preferably, from a processing standpoint, part of second metal layer 6, and deposited at the same time. For example, in the process described in copending application Ser. No. 621,367, filed Nov. 30, 1990, assigned to SGS-Thomson Microelectronics, Inc., and in the Chen, et al., article cited hereinabove, both incorporated herein by this reference, aluminum is sputtered at low enough rates, with the wafer at an elevated temperature, such that the sputtered aluminum migrates along the surfaces of contact openings to the bottom. Continued sputtering, either at the same or an increased rate, completely fills the contact opening, in effect forming an aluminum plug therein.

Alternatively, other material may be used to fill vias 8a, 8b, to make connection between metal levels 4, 6. A common example of such an alternative is tungsten, as described in the Lee et al. article noted above. Other known materials used for such interconnection include metal silicides and other conductive metal compounds such as titanium nitride.

Referring to FIG. 2a, for purposes of description of the invention herein, no electrical connection exists between first level metal line 4a and second level metal 6 through via 8a, due to the presence of contaminant 7 therebetween. The connection between first level metal line 4b and second level metal 6 through 8b is a good one, in this example.

Figure 1:
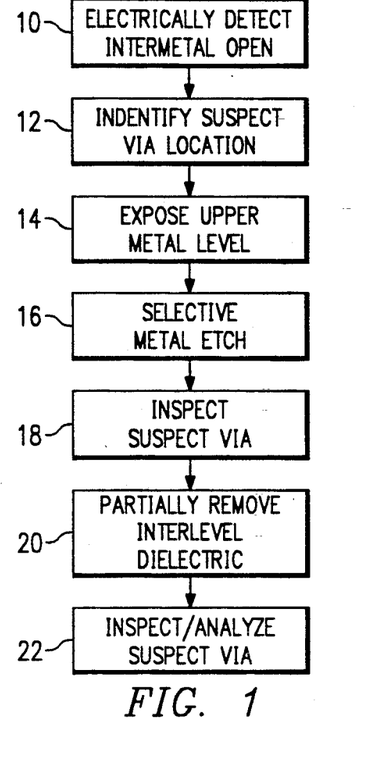
FIG. 1 is a flow chart of the analysis method according to the preferred embodiment of the invention.

Referring now to FIG. 1, a method of analyzing suspected failing connections between metallization layers, such as the failure of via 8a of FIG. 2a, according to the preferred embodiment of the invention will now be described in detail. In process 10, the presence of an open, or excessively resistive, contact is detected. The detection of such a failure may come from one of several sources. Many such failures, particularly the most "hard" opens, are detected at the first electrical test of the integrated circuit after its manufacture; this first test is generally in wafer form, such as during multiprobe functional electrical testing. Subsequent electrical testing, such as after packaging of the integrated circuit, may also detect open via failures, particularly where the defect is due to a thin insulating contaminant which is sufficiently leaky so that a relatively slow electrical test (as may be done at multiprobe) will not detect the failure, but where the resistance and capacitance presented by the contaminant reduces the switching speed of the circuit to such an extent that high-speed testing detects the failure. Open via failures may also be detected for the first time in accelerated reliability testing, and also possibly during operation, where the physical contact between first level metal 4 and second level metal 6 exists at time-zero, but is so small that current-dependent electromigration of the physical contact occurs over time, causing a later-life open via.

After detecting the electrical failure in process 10, process 12 may be performed in which one or more suspected locations of open vias are identified. For example, referring to FIG. 3a, an open circuit between metal line 6 and metal line 4a can be distinguished from the good connection between metal line 6 and metal line 4b, either by interpretation of the functional test results, or by way of internal probing of the circuit. Identification of suspect vias by electrical means in process 12 is not essential to the process of this embodiment of the invention, as subsequent inspection will allow for detection of open vias, but such identification is preferred, especially for small vias on the order of one micron in size or less, and especially in large integrated circuits with many (e.g., millions) of contacts, to reduce the extent to which subsequent visual inspection is required.

Process 14 begins the deprocessing of the integrated circuit according to this embodiment of the invention. In process 14, the integrated circuit is deprocessed so that the upper level metal 6 is exposed. If the integrated circuit is still in wafer form, this only requires removal of the conventional protective overcoat, and also such other conductive layers as may be present above that of the suspected location of the failure. Of course, if the integrated circuit chip is packaged at the time the failure is detected in process 10, removal of the plastic encapsulant (or decapping of the ceramic package, as the case may be) must be performed prior to the removal of the protective overcoat. The integrated circuit will thus be in the condition illustrated in FIGS. 2a and 3a.

Figure 2B:
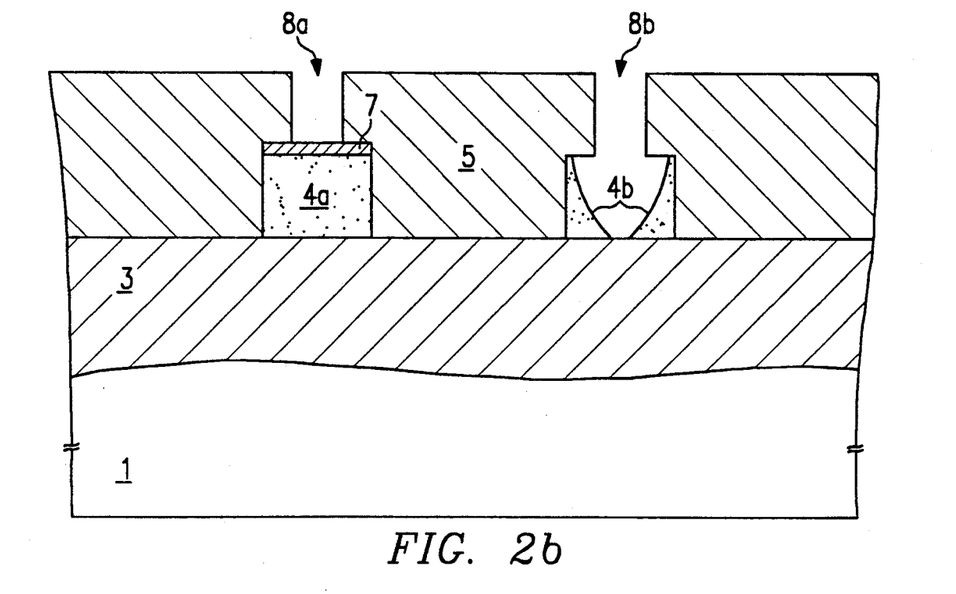
Figure 3B:
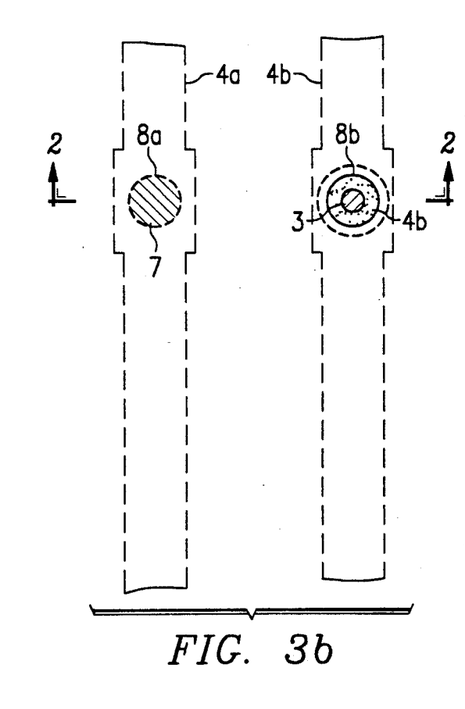

According to this embodiment of the invention, process 16 is next performed. In process 16, the integrated circuit is subjected to an etch which selectively removes the metal material of second level metal 6 and first level metal 4, relative to insulating materials such as that of interlevel dielectric 5. In the above-described example where metal levels 4, 6 are substantially aluminum, and where interlevel dielectric 5 is substantially silicon dioxide, the preferred etch in process 16 is a wet etch using hot phosphoric acid, as is conventional in the art for the wet etch of aluminum based metals. An example of conditions for the wet etch of process 16 is the use of 85% phosphoric acid at a temperature of 100° C., for on the order of six seconds; a preferred sequence is to perform short etches for on the order of two seconds, with a visual inspection performed after each. This wet etch removes aluminum-based metals while not significantly removing silicon dioxide. FIGS. 2b and 3b illustrate the state of the exemplary integrated circuit after the selective metal etch of process 16.

As a result of process 16, the distinction between failing via 8a and good via 8b may initially be made. As shown in FIG. 2b, for good via 8b the metal etch will not only remove second level metal 6, but will also remove portions of first level metal line 6b at locations within via 8b where the two are in physical contact with one another. In addition, since the wet etch of this example is isotropic, the etch will undercut interlevel dielectric 5, as illustrated in FIG. 2b. At failing via 8a, however, due to the presence of contaminant 7 between first level metal line 4a and second level metal 6, the etch of process 16 will stop after second level metal 6 is removed.

For the case of a hot phosphoric acid etch in process 16, a wide range of contaminants which are likely to cause open via failures such as shown at via 8a in FIG. 2b will stop the etch, and prevent etching of the underlying first level metal line 4a thereat. Examples of such contaminants which are relatively impervious to hot phosphoric acid include silicon dioxide, photoresist, silicon nitride, and silicon.

Inspection of vias 8a, 8b visually, by SEM, or both, is then preferably performed in process 18, in which vias 8a, 8b are viewed from the surface (i.e., in plan view) rather than in cross-section as conventional for open via failure analysis. As illustrated schematically in FIG. 3b, first level metal line 4b will be visible to some extent at the location of good via 8b, so long as the metal etch of process 16 stops prior to total removal thereof; the underlying material such as insulating layer 3 will be visible at the center of via 8b (or, if the etch continues too long, within the entire area of via 8b). Due to the presence of impervious contaminant 7 at failing via 8a, however, first level metal line 4a will remain intact, and visible through the overlying contaminant 7 (at the location of via 8a) and through interlevel dielectric 5.

Referring still to FIG. 3b, it should be noted that the plan view of good via 8b will show exposed first level metal line 4b only within the area of via 8b; similarly, the size of the exposed portion of contaminant 7 is, at the maximum, the size of via 8a. It is therefore preferred to perform a partial etch of interlevel dielectric 5, in process 20 of FIG. 1, so that the portion of interlevel dielectric 5 which overlies first level metal lines 4a, 4b is partially removed. The preferred etchant for process 20 according to this embodiment of the invention, where interlevel dielectric 5 is doped CVD silicon dioxide of thickness on the order of 10 kÅ, is a wet etch using the well known "modified oxide etch", the composition of which includes 21% by weight ammonium fluoride (40% concentration), 3.4% by weight phosphoric acid (85% concentration), and 4% by weight dibasic ammonium phosphate, at room temperature for on the order of three to four minutes.

Figure 2C:
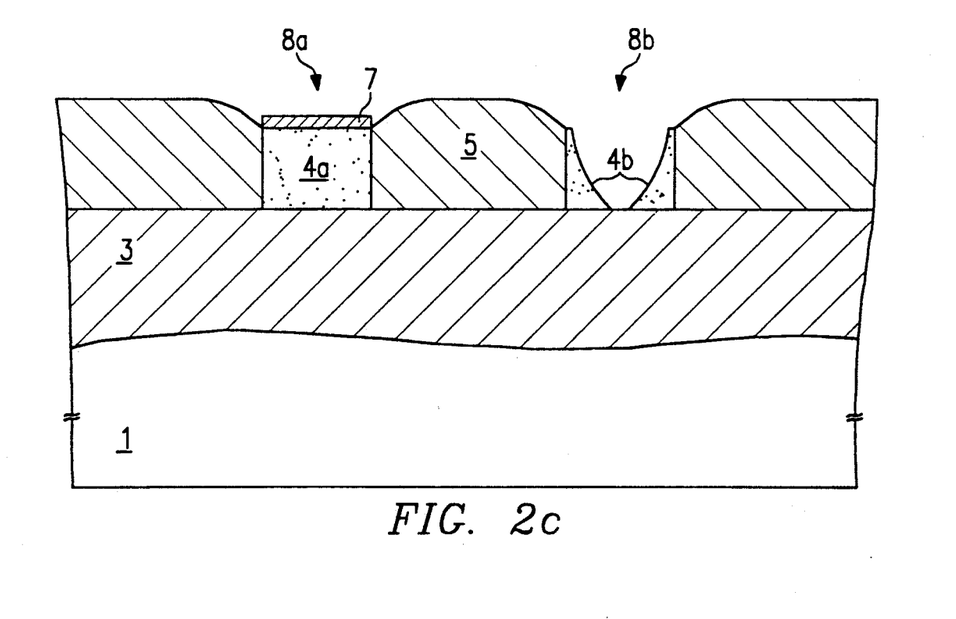
Figure 3C:
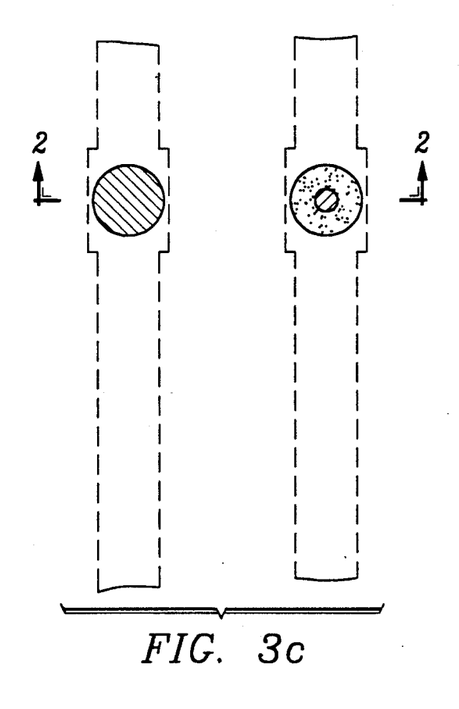

The results of the etch of process 20 are illustrated in FIGS. 2c and 3c. As shown in FIG. 2c, the oxide etch of process 20 fully exposes contaminant 7 at the surface of first level metal line 7a at the location of via 8a, and also removes the overhang of interlevel dielectric 5 at the location of via 8b to fully expose the beveled remainder of first level metal line 4b. As shown in FIG. 3c, which represents the view of the inspection of process 22, a greater portion of first level metal line 4b is exposed at via 8b, with this exposed portion being beveled toward the center of via 8b, and insulating layer 3 exposed thereat. The partial removal of interlevel dielectric 5 also exposes a greater area of contaminant 7, which facilitates the inspection and analysis of the suspect via 8a in process 22. As a result, the ability to visually (via optical microscopy) distinguish failed via 8a from good via 8b is improved by the partial removal of interlevel dielectric 5.

In addition, the increase in the exposed area of contaminant 7 in via 8a which results from the partial removal of interlevel dielectric 5 facilitates analytical analysis of the composition of contaminant 7. Conventional analytical techniques for determining the composition of contaminant 7, such composition indicative of the cause of its presence at via 8a, include Auger spectroscopy, XES spectroscopy, and EDS analysis, as well as other well known techniques. The selection of which ones or more of such analytical techniques will depend upon factors such as the likelihood of certain types of contaminant, as well as the results obtained by the particular analysis techniques used on this or other failing vias.

After such analysis, interlevel dielectric 5 may be fully removed by way of wet etch, if desired, followed by analysis of the results. Full removal of interlevel dielectric 5 may be particularly useful if one or more dopants are used in second level metal 6 which are not used in first level metal 4; an example of such a dopant is copper, as noted hereinabove. Analysis of the vias 8a, 8b after interlevel dielectric 5 is fully removed allows for detection of such dopant therein, further distinguishing failed via 8a from good via 8b.

According to the present invention, improved capability for determining the cause of a failed via is provided over prior via analysis techniques. A first improvement is in enlarging the cross-sectional area of the failure cause in an open via, by using top-down deprocessing according to the present invention in contrast with sectioning of the via; such enlargement of the failure cause facilitates spectroscopic analysis of the material. In addition, the difficulty of successfully sectioning a failing via to expose the cause of failure (and without losing the failure cause) particularly if the cause of failure does not cover the entire via, is avoided by the present invention. It is therefore contemplated that the present invention will be particularly beneficial for analysis of integrated circuits with increasingly smaller geometries.

Referring now to FIGS. 4a through 4j, actual results of analysis of an actual failed via according to the preferred embodiment of the invention will now be described. In the example shown therein, the first level metal is silicon-doped aluminum of a thickness on the order of 7 kÅ, and the second level metal is copper-doped aluminum of a thickness on the order of 9 kÅ. The thickness of the interlevel dielectric therebetween is on the order of 10 kÅ, and the size of the vias through which connection is made is on the order of 1.5 µm in diameter.

Figure 4A:
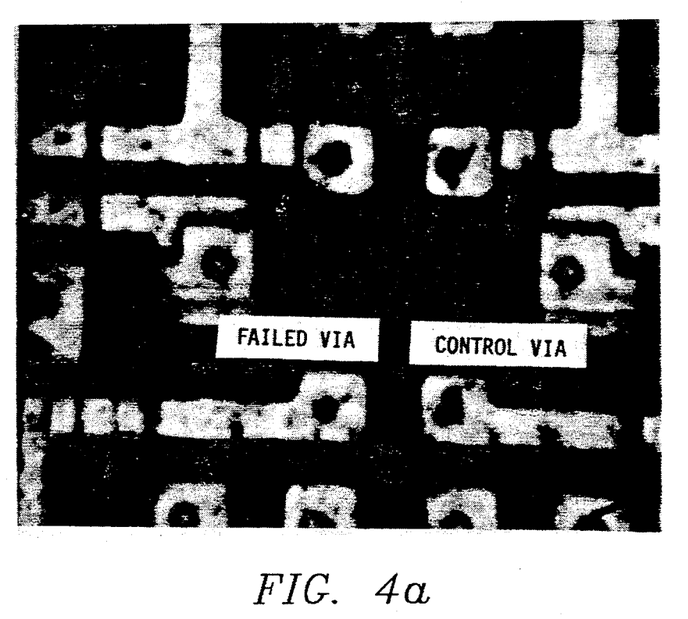
FIGS. 4a through 4d, 4i, and 4j, are optical and SEM microphotographs of actual vias in stages of analysis according to the present invention.
Figure 4B:
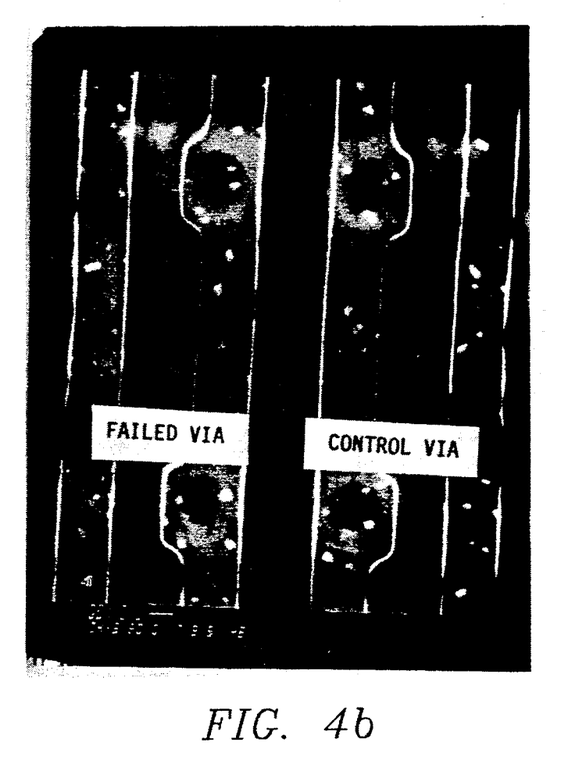

FIG. 4a is an optical microphotograph of the integrated circuit analyzed in this example, with the failed via and control (or "good") via illustrated therein. The stage of the process according to the present invention which is illustrated in FIG. 4a, corresponds to the inspection of process 18, where the second level metal has been removed with a selective etch, such as hot (approximately 100° C.) phosphoric acid. As is apparent from FIG. 4a, first level metal can be seen as partially removed for the control via, but fully in place for the failing via; FIG. 4b is an SEM microphotograph of the failing and control vias of FIG. 4a, and more clearly shows the distinction therebetween due to the selective metal etch.

Figure 4C:
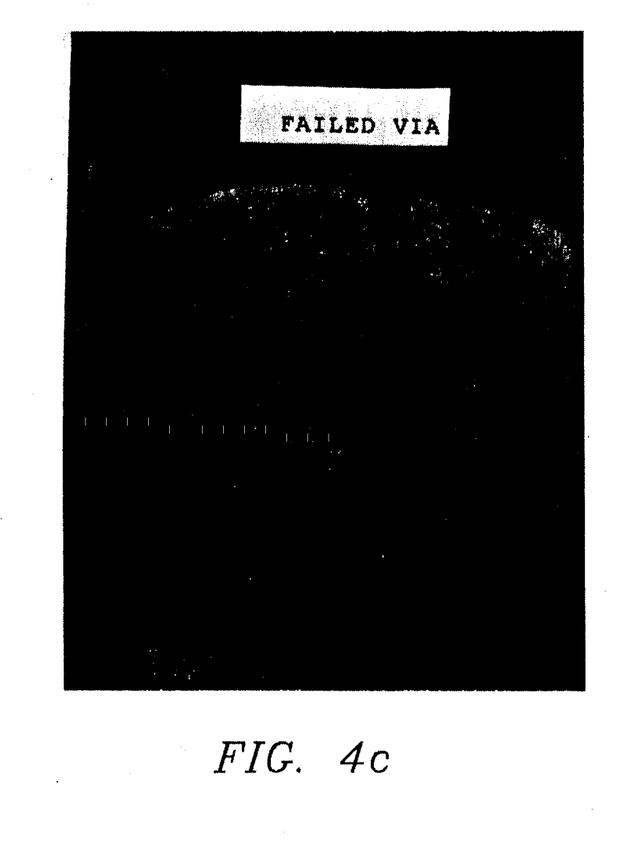
Figure 4D:
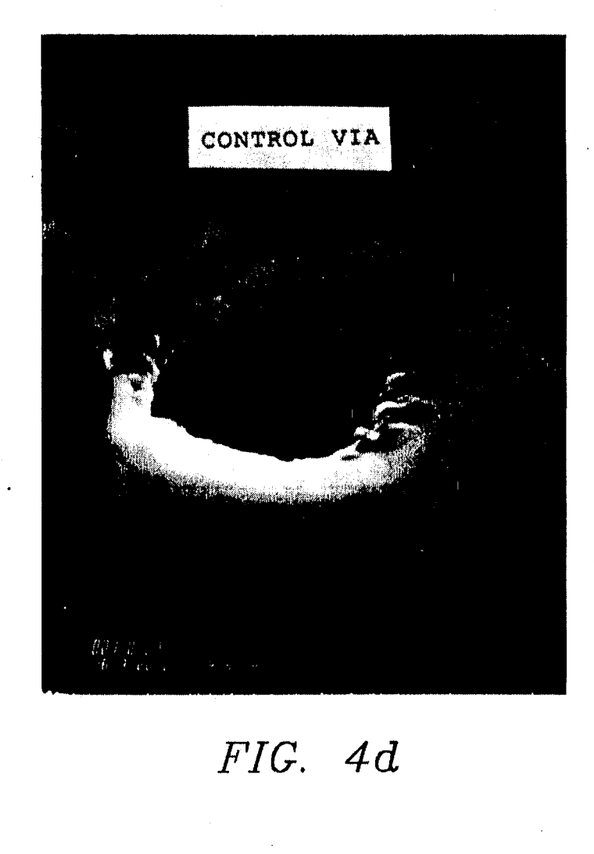

As noted hereinabove, process 20 of the partial removal of interlevel dielectric facilitates the distinction between good and open vias, by exposing the beveled first level metal under the overhang thereof. Referring now to FIGS. 4c and 4d together, SEM microphotographs of the failed and control vias are illustrated after partial removal of the interlevel dielectric, for example by using a wet oxide etch of modified oxide etch, for a time of on the order of 1 minute, remove approximately 2.5 kÅ of the total thickness of the interlevel dielectric. In FIG. 4c, the first level metal can be seen as fully intact for the failed via, while in FIG. 4d the etching of the first level metal at the control via can be readily seen.

Figure 4E:
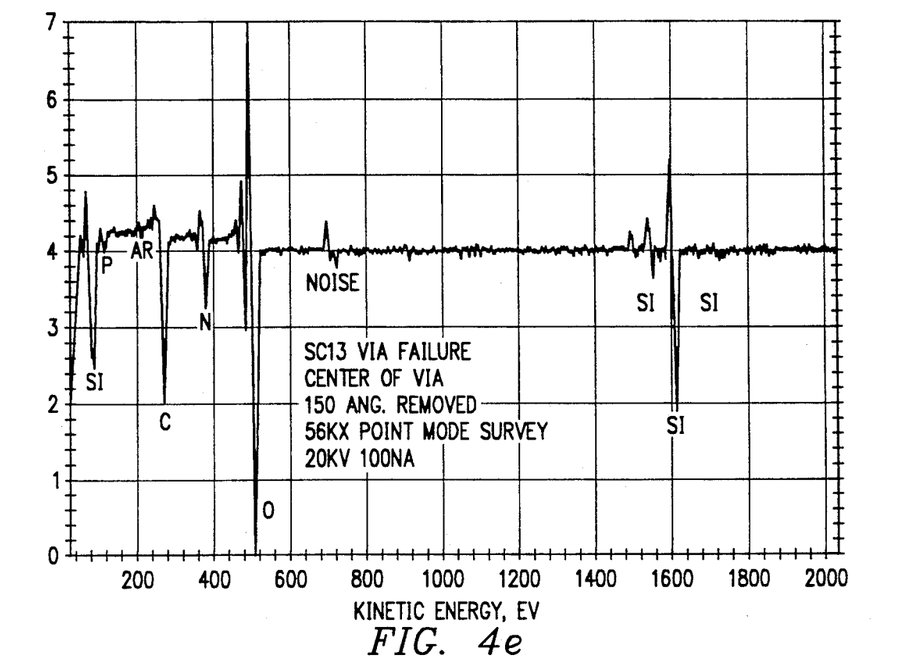
FIGS. 4e, 4f, 4k, and 4l are spectroscopy results from the analysis of the actual vias in FIGS. 4a through 4d, 4i and 4j.
Figure 4F:
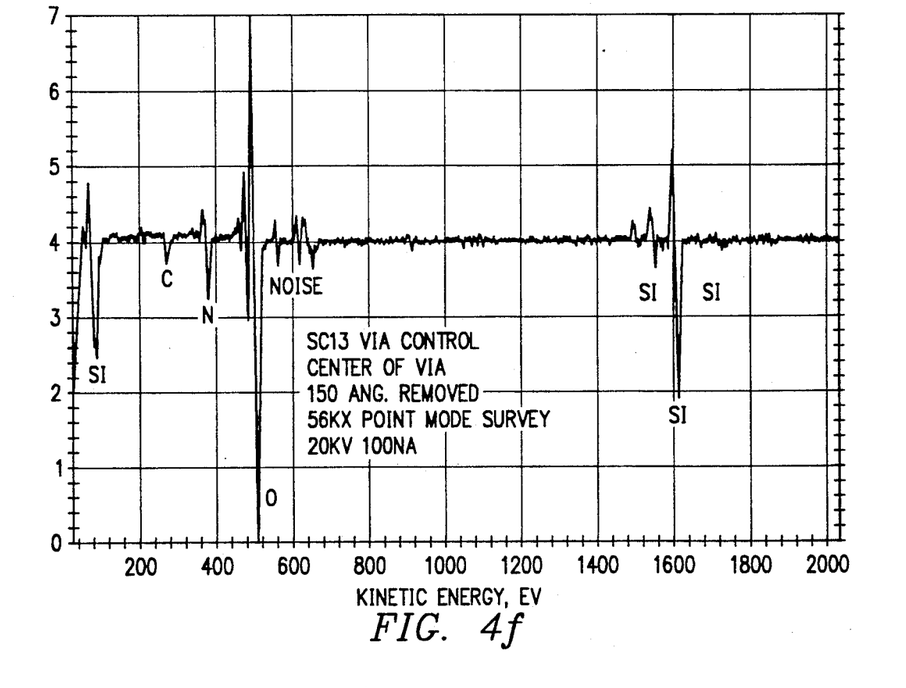
Figure 4G:
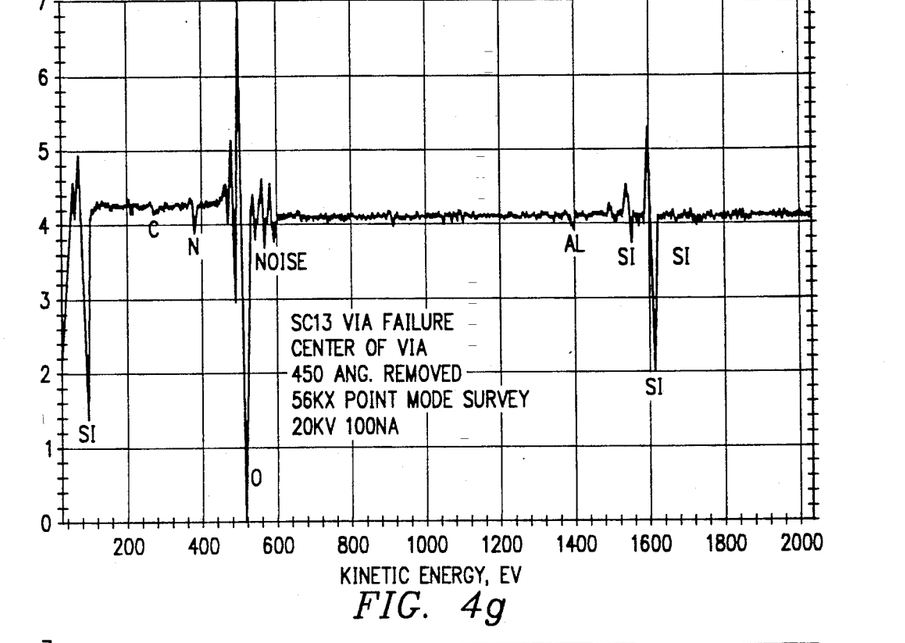
Figure 4H:
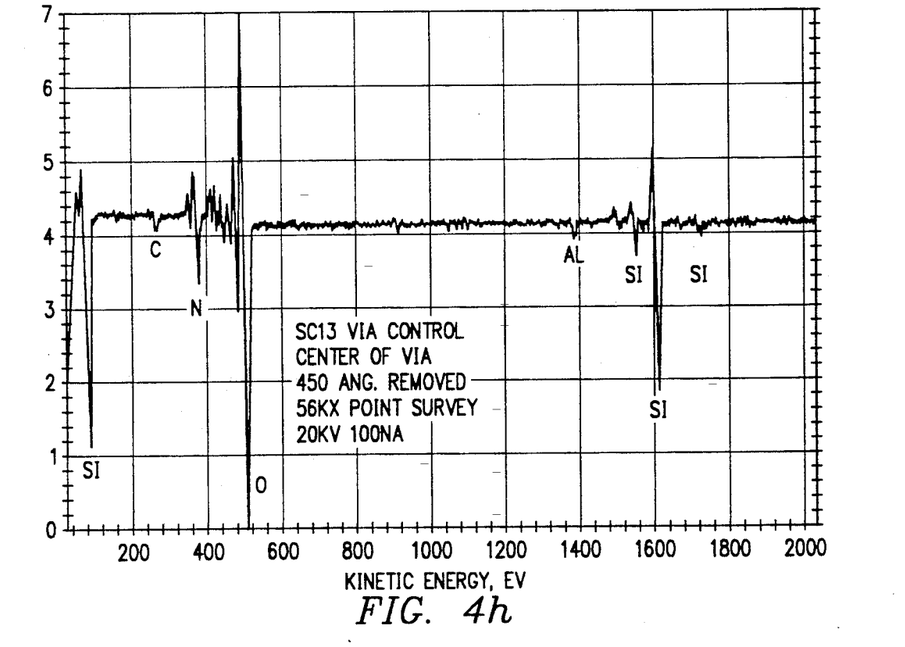

Also as noted hereinabove, the partial removal of the interlevel dielectric not only facilitates visual (or SEM) distinction between failing and good vias, but also exposes a sufficient area of the contaminant to allow for its analysis by Auger, EDS and other spectroscopy techniques. FIGS. 4e and 4f illustrate the results of Auger spectroscopy for the failed and control vias of FIGS. 4c and 4d, respectively, after partial removal of the interlevel dielectric; the illustrated results are after 15 nm of material have been sputtered off from each location (thus avoiding surface contamination of each via which may have occurred during the analysis). In this example, a significant carbon peak is evidenced for the failed via relative to the control via; as is well known, such a carbon peak often indicates the presence of an organic material. FIGS. 4g and 4h are the Auger results of the same locations of the failed and control vias, respectively, after removal of 45 nm of material thereat; comparison of FIGS. 4g and 4h shows that the carbon-bearing material in the failed material is less than 45 nm thick, as the carbon peak of FIG. 4g is much reduced. Based on these results, the cause of the open via, in this example, was deduced to be residual photoresist which was not removed in the stripping of photoresist after the first level metal etch in manufacture of the circuit. Such residual photoresist, as useful in both metal and oxide etches, is substantially impervious to the etches used in deprocessing the integrated circuit according to the present invention, and as such can be quite readily detected by this method.

Figure 4I:
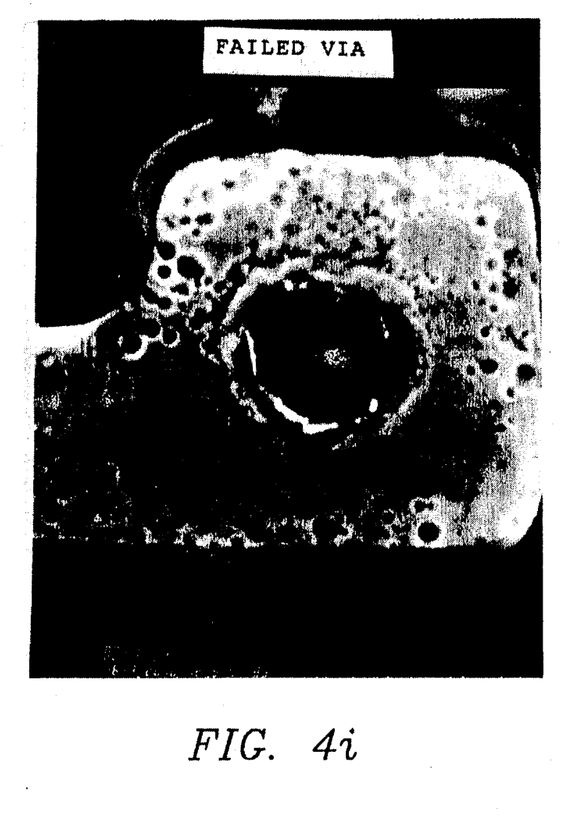
Figure 4J:
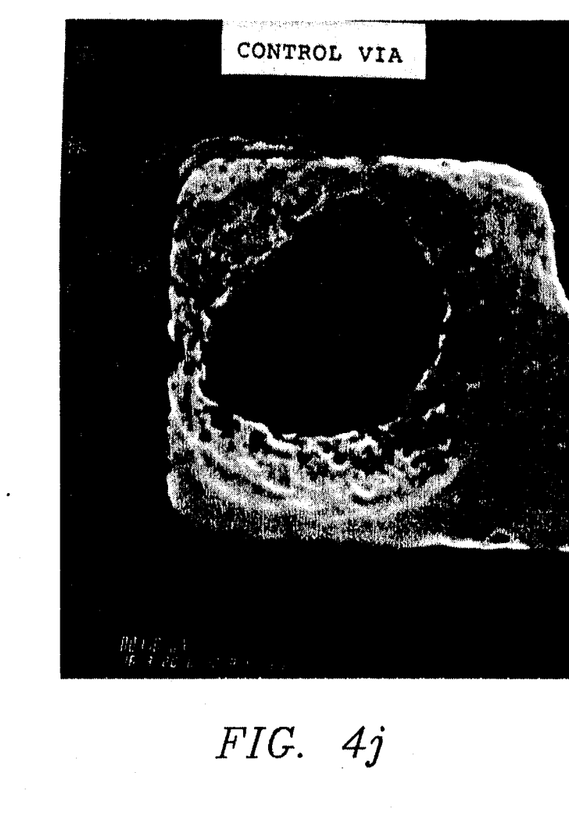
Figure 4K:
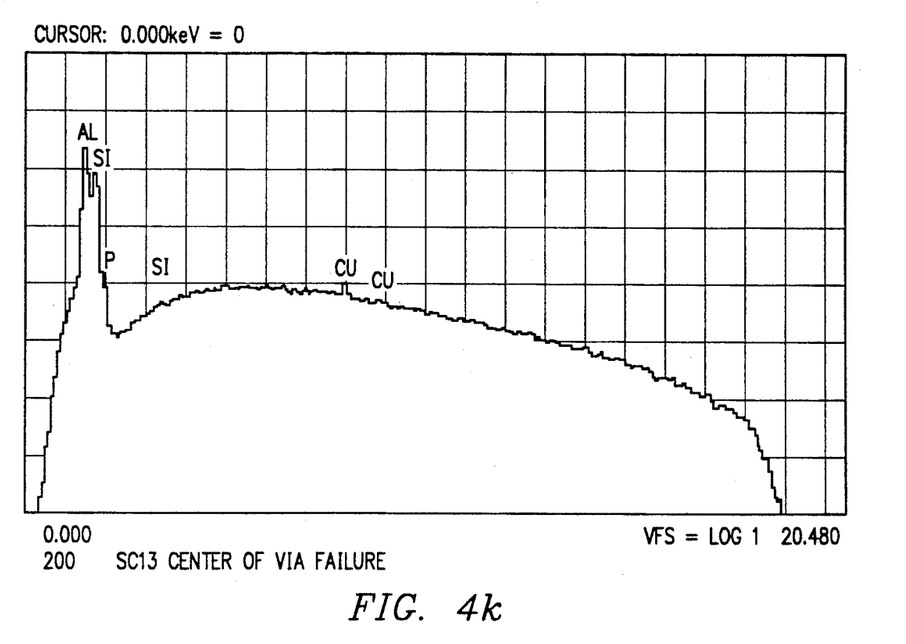
Figure 4L:
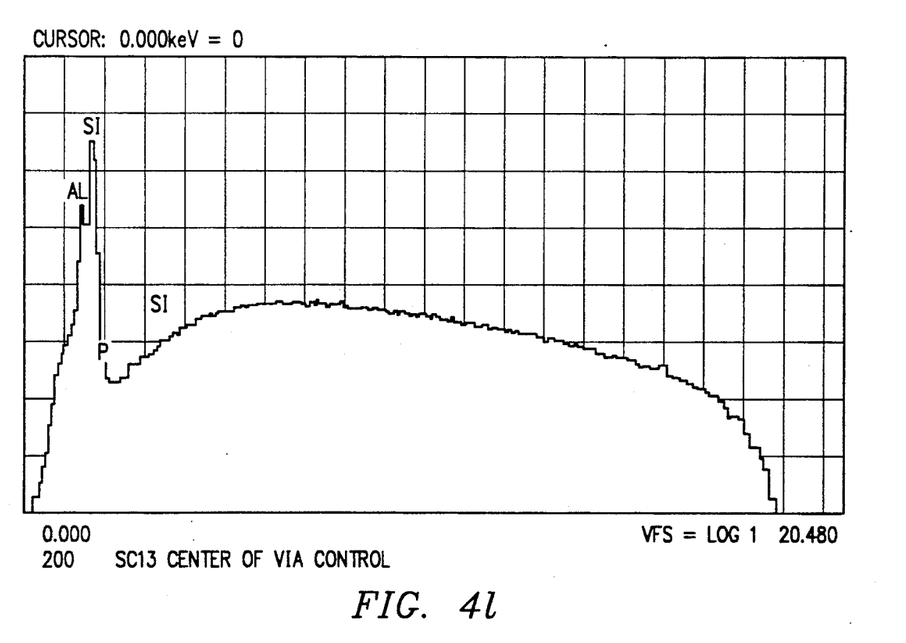

FIGS. 4i and 4j are SEM microphotographs of the failed and control vias, respectively, of this example are illustrated after full removal of the interlevel dielectric. Further distinction between the failing and control vias can be readily seen from a comparison of FIGS. 4i and 4j, particularly relative to the amount of first level metal remaining. FIGS. 4k and 4l are the results of EDS spectroscopy of the failed and control vias, respectively, after full removal of the interlevel dielectric. The presence of copper is evident in the spectrum of the failed via (FIG. 4k), but not in the spectrum of the control via (FIG. 4l), further indicating the presence of metal remaining thereat.

It is contemplated that the foregoing example is illustrative of the method of analyzing the cause of an open via according to the present invention, and particularly illustrates the ability to determine the cause of failure without requiring cross-section of the failing via.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A destructive method of determining the cause of an open circuit between first and second metal layers in an integrated circuit, said second metal layer overlying said first metal layer with an interlevel dielectric layer therebetween when viewing the active surface of said integrated circuit, said first and second metal layers intended to be connected to one another through a via in said interlevel dielectric layer, comprising:

removing said second metal layer from a location over the via with an etchant which selectively removes metal relative to dielectric material; and inspecting the active surface of said integrated circuit to determine the extent to which said first metal layer at the location of said via was removed in said removing step, if any.

2. The method of claim 1, wherein said inspecting step comprises spectrally analyzing the composition of materials at the location of said via.

3. The method of claim 1, further comprising:
after said step of removing said second metal layer, removing a portion of said interlevel dielectric layer.

4. The method of claim 3, wherein said inspecting step comprises spectrally analyzing the composition of materials at the location of said via.

5. The method of claim 1, wherein said first and second metal layers each comprise aluminum.

6. The method of claim 5, wherein said integrated circuit further comprises a non-aluminum metal disposed within said via for connecting said first and second metal layers to one another.

7. The method of claim 6, wherein said second metal layer is doped with a dopant;
and wherein said first metal layer is not doped with said dopant.

8. The method of claim 6, wherein said interlevel dielectric comprises silicon dioxide.

9. The method of claim 8, wherein said etchant comprises hot phosphoric acid.

10. A destructive method of identifying a contaminant disposed in a via through an interlevel dielectric layer between first and second level metal layers in an integrated circuit, said second level metal layer overlying said first level metal layer when viewing the active surface of said integrated circuit, comprising:

selectively etching said second level metal layer relative to said contaminant, from its location overlying said via; and inspecting the surface of said integrated circuit at the location of said via to determine if a portion of said first level metal layer at the location of said via was removed in said etching step.

11. The method of claim 10, further comprising:
electrically exercising said integrated circuit to identify said via prior to said etching step.

12. The method of claim 10, wherein said inspecting step comprises spectrally analyzing the composition of materials at the location of said via.

13. The method of claim 10, wherein said etching step comprises isotropically etching said second level metal layer.

14. The method of claim 13, further comprising:
after said etching step, removing a portion of said interlevel dielectric layer.

15. The method of claim 14, wherein said inspecting step comprises spectrally analyzing the composition of materials at the location of said via.

16. The method of claim 10, wherein said first and second level metal layers each comprise aluminum.

17. The method of claim 16, wherein said integrated circuit further comprises a non-aluminum metal is disposed within said via for connecting said first and second metal level metal layers to one another.

18. The method of claim 17, wherein said interlevel dielectric comprises silicon dioxide;
and wherein said etchant comprises hot phosphoric acid.

19. The method of claim 18, wherein said contaminant comprises organic material.

* * * * *